(12) United States Patent
Sieg

(10) Patent No.: US 11,456,722 B2
(45) Date of Patent: Sep. 27, 2022

(54) ARRANGEMENT FOR A VEHICLE FOR DETECTING AN ACTIVATION ACTION FOR ACTIVATING A FUNCTION ON THE VEHICLE

(71) Applicant: Huf Hülsbeck & Fürst GmbH & Co. KG, Velbert (DE)

(72) Inventor: Berthold Sieg, Bottrop (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 0 days.

(21) Appl. No.: 17/198,639

(22) Filed: Mar. 11, 2021

(65) Prior Publication Data

US 2021/0367584 A1 Nov. 25, 2021

(30) Foreign Application Priority Data

May 19, 2020 (DE) ...................... 10 2020 113 483.5

(51) Int. Cl.
| | |
|---|---|
| *H03K 17/955* | (2006.01) |
| *G01D 5/24* | (2006.01) |
| *H03H 9/54* | (2006.01) |
| *H04L 67/12* | (2022.01) |
| *H03H 9/52* | (2006.01) |
| *E05B 81/64* | (2014.01) |

(52) U.S. Cl.
CPC ............ *H03H 9/542* (2013.01); *E05B 81/64* (2013.01); *G01D 5/24* (2013.01); *H03H 9/52* (2013.01); *H03K 17/955* (2013.01); *H04L 67/12* (2013.01)

(58) Field of Classification Search
CPC .......... H03H 9/542; H03H 9/52; H04L 67/12; H03K 17/955; E05B 81/64; G01D 5/24
See application file for complete search history.

(56) References Cited

U.S. PATENT DOCUMENTS

| | | | |
|---|---|---|---|
| 7,202,674 B2 * | 4/2007 | Nakano ................... | E05F 15/44 |
| | | | 324/661 |
| 2010/0060296 A1 * | 3/2010 | Jiang ...................... | G01D 18/00 |
| | | | 324/613 |

FOREIGN PATENT DOCUMENTS

| | | | |
|---|---|---|---|
| WO | WO 9741458 A1 | * | 11/1997 |
| WO | WO 2007079728 A2 | * | 7/2007 |
| WO | WO 2018077355 A1 | * | 5/2018 |

* cited by examiner

*Primary Examiner* — Dinh T Le
(74) *Attorney, Agent, or Firm* — Bret E. Field; Bozicevic, Field & Francis LLP

(57) ABSTRACT

The invention relates to an arrangement (10) for a vehicle (1) for detecting an activation action for activating a function on the vehicle (1), comprising:
at least one sensor element (21) for sensing a change in a vicinity of the sensor element (21),
a controlling arrangement (80) for an electric control of the sensor element (21) in order to provide a sensing signal (S), the frequencies of which comprise at least one predefined sensing frequency,
an evaluation arrangement (90), which is interconnected to the sensor element (21) via a signal path (SP) in order to use the sensing signal (S) to repeatedly determine at least one parameter of the sensor element (21) specific to the sensing for detecting the activation action,
a filter arrangement (40) in the signal path (SP) comprising at least one high-pass (41, 43) in order to at least reduce the frequencies of the sensing signal (S) lower than the at least one sensing frequency.

14 Claims, 7 Drawing Sheets

Figure 1:
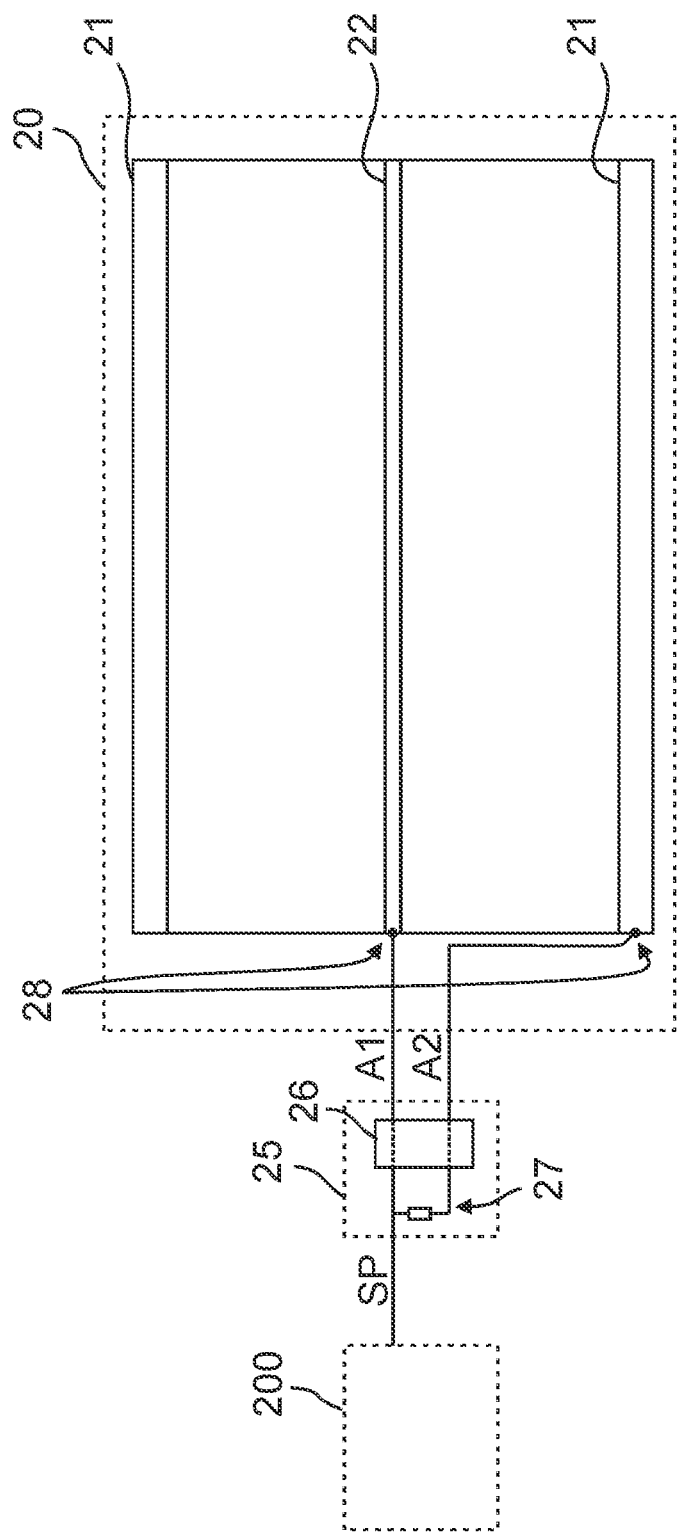

ARRANGEMENT FOR A VEHICLE FOR DETECTING AN ACTIVATION ACTION FOR ACTIVATING A FUNCTION ON THE VEHICLE

The present invention relates to an arrangement for a vehicle for detecting an activation action for activating a function on the vehicle. Furthermore, the invention relates to a method as well as a use.

It is known from the prior art that capacitive sensors are used in vehicles to detect activation actions. These are used, for example, to detect an approach of a user or also a more complex activation action of the user. In response to the detection, a lid can be activated and/or an authentication with the user can be initiated, for example.

However, conventional sensors may have the problem that the detection is disturbed by interfering electric effects such as static charges from the user.

It is therefore an object of the present invention to at least partially remedy the disadvantages described above. In particular, it is an object of the present invention to provide an improved means for detecting an activation action.

The foregoing object is solved by an arrangement with the features of the independent device claim, a method with the features of the independent method claim, and by a use with the features of the independent use claim. Further features and details of the invention result from the respective dependent claims, the description and the figures. Features and details described in connection with the arrangement according to the invention of course also apply in connection with the method according to the invention as well as the use according to the invention, and vice versa in each case, so that with regard to the disclosure concerning the individual aspects of the invention reference is or can always be made mutually.

The object is solved in particular by an arrangement, in particular an electronic circuit arrangement, for a vehicle, in particular a motor vehicle, for detecting an activation action for activating a function on the vehicle. The activation action, such as an approach or a gesture, can accordingly have the purpose of activating the function on the vehicle. For example, the function is an opening and/or unlocking of a lid on the vehicle. For example, the arrangement may be adapted to provide a detection of the activation action in a front, side and/or rear region of the vehicle for activating (the function in the manner of) an opening and/or unlocking of a lid on the vehicle. To perform the activation action, the user himself/herself may be conceived as an activation means, or the user may use an activation means such as a foot for this purpose. For example, the activation action may be a foot movement underneath a bumper of the vehicle. The activation action comprises, for example, a forward movement in a first direction underneath the bumper and a subsequent rearward movement.

The arrangement according to the invention may comprise at least one of the following components:
  at least one (in particular electrically conductive) sensor element for (in particular capacitive) sensing of a change, preferably an approach and/or a gesture by an activation means (such as the user), in a vicinity of the sensor element,
  a, in particular electronic, controlling arrangement for an electric control of the sensor element (preferably with a controlling signal) in order to provide a sensing signal (in particular for sensing), the frequencies of which comprise at least one predefined sensing frequency, and which is in particular dependent on the sensed change,
  a, preferably electronic, evaluation arrangement which is interconnected to the sensor element via a signal path in order to use the sensing signal to repeatedly determine at least one parameter of the sensor element specific to the sensing, in particular a variable sensor capacitance, for detecting the activation action,
  a, in particular electronic, filter arrangement in the signal path, which preferably comprises at least one high-pass in order to at least reduce, i.e. partially or also completely attenuate, the frequencies of the sensing signal lower than the at least one sensing frequency, and/or in order to pass the at least one sensing frequency.

This makes it possible to filter out interfering frequencies that can impair the detection. It is particularly advantageous here if the filter arrangement in the signal path filters the sensing signal received from the sensor element for evaluation by the evaluation arrangement, which is used for evaluation to determine the parameter. In other words, the filter arrangement can filter the transmitted electric charges in a frequency-dependent manner, which are transmitted from the sensor element to the evaluation arrangement. If necessary, the transmission can be further amplified and/or adapted within the signal path, for example by means of an operational amplifier. The sensing signal must therefore not necessarily be understood as a single specific electric current, but rather as an information carrier, since amplifying components can also be interconnected in the signal path.

The controlling arrangement and the evaluation arrangement can each be designed as an electronic circuit arrangement and also comprise common electronic components. For example, a processing device such as a microcontroller is provided, which can be part of both the controlling arrangement and the evaluation arrangement. Furthermore, a printed circuit board may be provided on which the components of the arrangement according to the invention are at least partially arranged. Specifically, at least the evaluation arrangement and the controlling arrangement may be fixed to the printed circuit board.

The arrangement according to the invention can be designed to be fixed to and/or in a vehicle component of the vehicle (in a form- or force-fitting or material-locking manner). For example, integration of the arrangement according to the invention into a bumper or a door handle or the like may be provided. The vehicle component can form with the arrangement according to the invention an assembly unit which can be handled individually and which can be mounted as a single component. The sensor element can extend, for example, on the inside of the bumper, and can be fixed there in a form- or force- or material-locking manner.

The signal path can comprise at least one or exactly one current path in which in each case an identical current (of the same amperage) flows and/or an identical electric potential is provided. Alternatively or additionally, the signal path can concern the path which leads from the sensor element to the evaluation arrangement and/or in which the sensing signal is transmitted from the sensor element to the evaluation arrangement. Optionally, the electric potential and/or the amperage can also change in the signal path, or an impedance conversion or a galvanic isolation or the like can be provided in the signal path, in particular as long as the transmission of the sensing signal is ensured.

The at least one sensing frequency can designate a frequency range in a frequency spectrum—i.e. several frequencies—which is provided for the sensing signal. The sensing signal is provided, for example, as a periodic signal and/or as a sinusoidal signal. The sensing signal can thus be defined as a sinusoidal signal and thus (in actual operation) be provided substantially sinusoidally. By definition, the sensing signal can therefore also occupy only a small frequency range in the frequency spectrum, if necessary. Frequencies which occur outside this defined frequency range in actual operation with the sensing signal are thus to be understood as interfering frequency components. One cause for these interfering frequencies can be seen in a charge shift due to an electric induction. This occurs, for example, as a direct current, and is thus characterized by low frequencies in the frequency spectrum of the sensing signal. The filter arrangement can thus be designed to filter out these low frequencies and advantageously also other interference frequencies in the sensing signal. Thus, the actually present (interfered) sensing signal can be converted by the filter arrangement into a filtered sensing signal, in which the interfering frequencies are reduced, and which can be evaluated by the evaluation arrangement. This means that the filtered sensing signal can correspond more to the defined frequency range in terms of its frequencies than the interfered sensing signal. This has the advantage that interfering influences are filtered out and can less impair the evaluation by the evaluation arrangement.

The sensing frequency is preferably defined in such a way that it enables optimized signal transmission according to EMC (electromagnetic compatibility) criteria. For example, the sensing frequency may be predefined as 333 kHz, e.g. as the center frequency of the frequency range of the sensing signal. Therefore, the filter arrangement may be designed to pass this sensing frequency, and to attenuate other frequencies. Further, the sensing signal may comprise an amplitude that alternates between two peak values such as −1 V and +1 V.

It is also advantageous if the vehicle is designed as a motor vehicle, in particular as a hybrid vehicle or as an electric vehicle, preferably with a high-voltage electric system and/or an electric motor. Furthermore, it may be possible that the vehicle is designed as a fuel cell vehicle and/or a passenger vehicle and/or a semi-autonomous or autonomous vehicle. Advantageously, the vehicle comprises a security system that enables authentication, for example, by means of communication with an identification transmitter (ID transmitter). Depending on the communication and/or authentication, at least one function of the vehicle can be activated. If authentication of the ID transmitter is necessary for this purpose, the function may be a security-relevant function, such as unlocking the vehicle and/or enabling an engine start. Thus, the security system can also be designed as a passive access system, which initiates the authentication and/or the activation of the function upon detection of the approach of the ID transmitter to the vehicle without active manual actuation of the ID transmitter. For this purpose, for example, a wake-up signal is repeatedly emitted by the security system, which can be received by the ID transmitter during the approach, and then triggers the authentication. Also, the function may concern an activation of a vehicle lighting and/or an actuation (opening and/or closing) of a lid (e.g. front or rear or side lid or door). For example, the vehicle lighting is automatically activated upon detecting the approach and/or the lid is actuated upon detecting a gesture by a user.

It is also conceivable that—for the activation of the function on the vehicle—an activation action is detected by an arrangement according to the invention. In particular, this can be an activation action outside the vehicle (which therefore does not take place in the vehicle interior). In other words, the vicinity of the sensor element in which the change is sensed may be outside the vehicle. If the activation action is successfully detected by the arrangement according to the invention, the function can thereby be triggered by the arrangement (in particular by a processing device) and/or the authentication can be initiated. The activation action may be, for example, the approach and/or the gesture, which is performed by means of the activation means. Advantageously, the activation means and/or the activation action can be detected even if the activation means is a non-electronic object (and thus not an ID transmitter). Instead, the activation means may be designed as a non-electric and/or non-metallic and/or biological substance, such as a body part of a user. Therefore, the use of capacitive sensing to detect the activation action is particularly advantageous, as this does not require any special precautions to be taken at the activation means.

An arrangement according to the invention is advantageously designed as an electronic circuit (circuit arrangement) and comprises electronic components which can be at least partially arranged on a printed circuit board and interconnected via electric conductor tracks. At least one of these components may also be designed as an integrated circuit (such as a processing device in the form of a microcontroller). Also, some of the components may be formed as SMD (surface-mounted device) devices. The sensor element may be electrically conductive, e.g., formed as a conductor track or as a planar electrode on the printed circuit board, or it may be connected to the printed circuit board via a supply line (such as an electric line). In the latter case, the sensor element is, for example, part of a cable (such as a coaxial cable), a flat electrode or an elongated conductor. The sensor element can also be regarded as a capacitive antenna, since a variable sensor capacitance is provided by the sensor element. Furthermore, the variable sensor capacitance can optionally also be provided by several sensor elements which are operated simultaneously or alternately. The printed circuit board and/or the sensor element is integrated, for example, in a door handle or in a bumper. The sensor element can be arranged in such a way that the arrangement of the sensor element defines a detection region for the activation action.

According to a further possibility, it can be provided that the sensor element is designed as an electrically conductive sensor electrode in order to provide the parameter specific to the sensing in the form of a variable sensor capacitance, and/or that the evaluation arrangement comprises an electronic processing device in order to evaluate the change in the sensor capacitance on the basis of the sensing signal. The sensing signal can, for example, be dependent on the sensor capacitance in terms of amplitude. This effect will be explained below, if necessary in simplified form. The sensor capacitance can be formed as an electric capacitance between the sensor electrode and at least one further electric conductor, such as a mass. The mass is provided, for example, by the body of the vehicle. A dielectric may be provided between the sensor electrode and the further electric conductor, such as a vicinity region of the vehicle, in which the activation action occurs. The activation action thus comprises an influence on the sensor capacitance. The sensing signal can be understood as a repeated electric charge transport, in which charge carriers are transported from the sensor electrode to the evaluation arrangement and vice versa. The quantity of charge carriers transported can then be dependent on the sensor capacitance. This means that the amplitude, in particular the amperage, of the sensing signal also changes depending on the sensor capacitance.

The sensor element can be understood as the sensor electrode of a capacitor, which comprises a variable capacitance (i.e. the sensor capacitance). During the control of the sensor element by the controlling arrangement, a charge shift can occur which is dependent on the sensor capacitance. Also, a shifting current can be caused by an induction. In principle, both can be measured by the evaluation arrangement. However, the shifting current can be attenuated or completely eliminated by the filter arrangement.

Of further advantage, it can be provided that the evaluation arrangement comprises an (in particular electronic) integrator arrangement for evaluating a charge quantity transmitted by the sensing signal and/or dependent on the change in the vicinity. For this purpose, the integrator arrangement can, for example, comprise an operational amplifier in order to form an electronic integrator (e.g. by means of a frequency-dependent counter coupling). The integrator arrangement of the evaluation arrangement can further accumulate the charge carrier quantity and thus evaluate the change. In this way, an output signal of the integrator arrangement can be specific for the presence of the activation action, so that, for example, an exceeding of a threshold value by the output signal leads to the detection of the activation action. This exceeding can, for example, be detected by the processing device, and in this way the change in the sensor capacitance can be evaluated on the basis of the sensing signal. The processing device is designed as a microcontroller, for example, and may additionally comprise at least part of the controlling arrangement, for example a digital-analogue converter. The controlling arrangement may, for example, form a signal generator to generate a controlling signal, such as a sinusoidal signal, which defines the waveform of the sensing signal.

Furthermore, it is conceivable that a transmission arrangement is provided in the signal path between the sensor element and the filter arrangement, which can comprise an electric voltage follower in order to provide the sensing signal to the filter arrangement depending on the change in the vicinity and/or depending on a variable sensor capacitance of the sensor element. For this purpose, the transmission arrangement may comprise, for example, an operational amplifier and at least one filter element, such as, for example, a capacitor and a resistor. By means of the at least one filter element, additional filtering of the controlling and/or sensing signal can be provided, for example, by means of a band-pass response and/or a frequency-dependent counter coupling. The sensing signal can be provided depending on the sensor capacitance, since the amount of charge transferred by the sensing signal can be dependent on the electric capacitance available at the sensor element. For this purpose, the sensing signal can be provided, for example, by the controlling arrangement by means of a periodic controlling signal, in particular a periodically changing voltage and/or a periodically changing current, preferably sinusoidal voltage or current. For this purpose, the sensor element can be controlled by the controlling arrangement by means of the controlling signal, so that the charge carrier transport to the sensor element is initiated. For this purpose, the controlling arrangement may form a signal generator which is electrically connected to the transmission arrangement so that the controlling signal from the transmission arrangement is converted into the sensing signal at the sensor element. For this purpose, the transmission arrangement may also perform an impedance conversion.

It can be provided that the transmission arrangement is designed for frequency-dependent and/or phase-dependent transmission, preferably for frequency-dependent and/or phase-dependent change, of an electric input signal, in particular a controlling signal. Furthermore, the transmission arrangement can be designed to output an (electric) output signal, wherein the output signal is dependent on the (frequency-dependent and/or phase-dependent transmitted/changed) input signal or controlling signal and preferably is defined by the input signal with regard to its signal form. The output signal can be understood as a forcibly guided sensor voltage and/or as a forcibly guided sensor current. An output of the transmission arrangement may be provided, which is electrically connected to the sensor element directly or indirectly, for electrically outputting the output signal at the sensor element. Furthermore, an input of the transmission arrangement can be provided, at which the input signal is provided. The input can be electrically connected to the controlling arrangement for this purpose.

In particular, it is provided that the transmission arrangement comprises a controlled source device (in particular electric source, such as a current or voltage source) in order to generate the output signal depending on the input signal and/or depending on the frequency-dependent and/or phase-dependent transmission, preferably frequency-dependent and/or phase-dependent change in the input signal (i.e. in particular controlled by the transmitted/changed input signal), and preferably to output it as a guided electric signal at the sensor element. This has the advantage that the spectrum of the input signal can be adapted by the transmission arrangement, i.e., for example, (undesired) interfering frequencies of the input signal can be filtered out and/or avoided when the output signal is output at the sensor element. In addition, however, the use of the source device can also ensure particularly reliably that the output signal applied to the sensor element continues to comprise (essentially, e.g. within a predetermined tolerance) the spectrum adapted by the transmission arrangement.

Particular advantage may be gained by using a controlled source device in the transmission arrangement to provide a guided signal at the sensor element. In particular, an interference-reduced output of the output signal is favored by the fact that the active generation of the output signal can cause the output signal to be guided at the sensor element, thereby counteracting the problem of radiated interference frequencies when the signal is output at the sensor element.

Advantageously, the invention may provide that the transmission arrangement is interconnected to the sensor element via a first terminal, and/or is interconnected to the evaluation arrangement and/or the filter arrangement via a second terminal, and/or is interconnected to the controlling arrangement via a third terminal. The transmission arrangement may comprise a voltage follower and/or voltage multiplier to generate an electric potential at the third terminal in the same or amplified manner via the first terminal at the sensor element, and/or in the same or amplified manner via the second terminal at the evaluation arrangement for the determination, preferably so that the electric potential at the sensor element and/or the electric potential at the second terminal follows the electric potential at the third terminal (amplified or with the same strength). Thus, a kind of "decoupling" by the transmission arrangement can occur, in which the transmission arrangement can be understood as a controlled voltage source. Based on the controlling signal (at the third terminal), a voltage can thereby be generated at the sensor element (at the first terminal) to effect the charge transfer. Based on the controlling signal and in particular the charge transfer, a sensing signal (at the second terminal) can also be generated in order to evaluate the parameter based on the sensing signal. For this purpose, the quantity of the transferred charges, for example the amperage, of the sensing signal is evaluated. The "decoupling" can reduce the load on the electric control of the sensor element.

Furthermore, a rectifier arrangement may be provided, which comprises one or more rectifiers. The rectifier arrangement may possibly operate without diodes or the like, so that essentially no (or almost no) voltage drop occurs at the rectifier arrangement. This can be implemented, for example, by performing the rectification by the rectifier arrangement by means of at least one electronic switch of the rectifier arrangement, which may be switched in a clocked manner.

The described rectification by the rectifier arrangement can be a "coherent" rectification by the at least one rectifier. This means that the at least one rectifier forwards the electric signal (sensing signal) from the filter arrangement to the integrator arrangement with a predefined clock respectively, preferably synchronized with the electric control by the controlling arrangement or depending on the controlling signal. This causes the sensing signal to be rectified coherently with the controlling signal. For this purpose, each of the rectifiers can comprise at least one electronic switch. The clock can be predefined in each case in such a way that only positive (or alternatively negative) half waves of a respectively predefined fundamental or harmonic of the electric signal (e.g. with the first harmonic as the fundamental of the frequency which is passed through the filter arrangement as the center frequency, and possibly further harmonics) are forwarded. Therefore, the respective clock may be synchronized with the controlling arrangement to be adapted to the shape of the electric signal (controlling signal) of the electric control or the signal at the sensor element. Alternatively, the rectification can be "incoherent" with diodes, if necessary.

The filter arrangement can comprise at least or exactly one sub-arrangement which provides the high-pass. The high-pass of the filter arrangement can be implemented as a single high-pass and/or as a first order high-pass. Thus, the filter arrangement as a whole may provide the high-pass at most up to first order in order to keep the complexity for the filter arrangement low. Furthermore, it is possible for the filter arrangement to comprise, in addition to the sub-arrangement for providing the first order high-pass, another sub-arrangement which also provides a first order high-pass. Together, this results accordingly in a second order high-pass to further improve the filtering. The formation of a high-pass of further orders by the filter arrangement is also conceivable, e.g. third order or fourth order, by using further corresponding sub-arrangements.

Furthermore, it may be advantageous within the scope of the invention that the filter arrangement comprises the high-pass in the manner of a high-pass of at least or exactly second order or third order or higher order. A second order high-pass can be provided, for example, by the filter arrangement comprising at least two sub-arrangements with a high-pass effect. For example, two capacitors are used in the filter arrangement for this purpose, or an inductor is used in addition to the capacitor of the first order high-pass filter. This has the advantage that the filtering out of frequencies below the sensing frequency is particularly reliable. The slope of the filter can be increased and—if the high-pass is part of a band-pass filter—the passband can comprise a flatter magnitude frequency response.

It is further conceivable within the scope of the invention that the filter arrangement comprises a first sub-arrangement with the high-pass and a second sub-arrangement with a low-pass. In this way, the filtering of the sensing signal can be further improved. The filter arrangement can provide a band-pass in this way. For this purpose, the filter arrangement can comprise at least one capacitor and/or at least one resistor and/or exclusively analog electric components.

Optionally, it is conceivable that the filter arrangement comprises a third sub-arrangement with a further high-pass. This results in a band-pass which is composed of a low-pass of at least or exactly first order and a high-pass of at least or exactly second order. Thus, it is possible to filter out also interfering frequencies above the sensing frequency.

Optionally, it can be provided that the filter arrangement forms a band-pass filter. This makes it possible to attenuate interference frequencies above the sensing frequency in addition to the interference frequencies below the sensing frequency.

It is further conceivable within the scope of the invention that the filter arrangement is designed to reduce an influence of an electric induction at the sensor element, in particular to reduce a shift of electric charges (in particular due to the action of an electric field on the sensor element). Specifically, the invention can address the interferences caused by static charges and/or by electric induction. A shift of charges (also referred to as shifting current) due to induction can be reproduced, for example, by using a cat skin. For centuries, the effect of induction has been known, which can be traced, for example, by rubbing over a cat skin due to the static charge. In the vicinity of an electric conductor, the induction due to this charge can lead to a shift of the charge carriers in the conductor. This effect can lead to the fact that in the sensor element—in particular due to an interaction with a neighboring conductor such as the still described additional conductor—it comes to charge shifts or the shifting current. These can be falsely recognized by the evaluation arrangement, i.e. the measuring unit, as a change in the sensor capacitance, or compensate for an actual change in the sensor capacitance. The latter would result in a failure to detect the activation action. Surprisingly, it was found in the context of the invention that the use of the filter arrangement at least leads to a reduction of this interference of the detection.

Furthermore, it may be provided in the context of the invention that a sensor arrangement is provided which comprises the sensor element, and comprises the or an additional electric conductor, wherein the additional conductor may be arranged at least partially or predominantly parallel to the sensor element. Also, the additional conductor and the sensing element may be fixed to each other. The additional conductor and the sensor element may each be formed as a conductor with an elongated extension, i.e., the extension in the longitudinal direction is substantially larger than in other directions (e.g., at least 10 times or at least 20 times or at least 50 times as large). In this case, the sensor element and/or the entire sensor arrangement can be designed as a cable. This makes it particularly easy to mount the sensor element on the vehicle. This design is particularly advantageous when using the sensor arrangement in a bumper of the vehicle in order to monitor a region outside the bumper by means of the sensor element.

It may also be possible to provide a sensor arrangement comprising the sensor element and at least one additional conductor. The additional conductor may be designed as an electric conductor like the sensor element, and thus comprise electrically conductive material. The additional conductor may have substantially the same length as the sensor element, and/or extend parallel to the sensor element. Therefore, there may be capacitive coupling between the additional conductor and the sensor element, for example in the pF range (F denotes the unit farad). The sensor element may be connected to the additional element in a predominantly insulated manner. Furthermore, it may be provided that the additional conductor and the sensor element also comprise an electric connection to each other. Therefore, the additional conductor and the sensor element may be electrically conductively connected to each other, for example directly or via at least one resistor. This connection may also be provided outside the sensor arrangement, for example by a terminal arrangement. In addition, the sensor element and the additional element can be coupled to mass, possibly also via the terminal arrangement. The terminal arrangement is interconnected, for example, between the sensor arrangement and a processing arrangement (described in more detail below). The (at least one) sensor element and the (at least one) additional conductor can each be designed as an electric conductor, in particular a stranded conductor or the like.

It can be provided that the sensor element surrounds the additional conductor at a constant distance. The sensor element can be originally provided as a shield for the additional conductor. An insulator may be provided between the additional conductor and the sensor element. The sensor arrangement may have an outer diameter of 1 to 50 mm. Further, the sensor arrangement and in particular the sensor element can have a round shape in cross-section or alternatively be designed as a flat cable. In the flat design, the height of the sensor arrangement may be smaller than the width by at least a factor of 2 or 5 or 10, and/or the length may be greater than the width by at least a factor of 2 or 5 or 10. According to the invention, the sensor element and in particular also the additional conductor can be used differently than according to the original intended use (in particular of a cable). In particular, the sensor element is used as a sensor electrode and the additional conductor is used without function. Furthermore, the sensor element may be electrically "floating" (floating), i.e. electrically connected at only one connection point. This avoids the sensor element being part of a galvanically closed circuit.

It is also conceivable that the or an additional conductor is electrically coupled to the sensor element via a terminal coupling. The coupling can be effected, for example, by a resistor of the terminal coupling, but alternatively or additionally also by another component such as a capacitor and/or a coil of the terminal coupling. Thus, the terminal coupling can be designed as a circuit arrangement of at least one component, and in particular can comprise two terminals for connection to the sensor element on the one hand and the additional conductor on the other hand. In particular, the terminal coupling may be provided in a connection device such as a plug, which is used to connect the sensor element to a processing arrangement. This allows easy mounting of the sensor element to the processing device. It is also possible to flexibly replace the sensor element while maintaining the same processing device. It may be possible that the terminal coupling is designed to allow a shifting current (due to induction) to flow via the terminal coupling during operation of the arrangement according to the invention. For this purpose, the terminal coupling may correspond to an electrically conductive and possibly low-impedance connection between the additional conductor and the sensor element.

In the arrangement according to the invention, the or a processing arrangement can be provided, which can comprise the controlling arrangement and/or the evaluation arrangement and/or a processing device, and is designed, for example, as a control apparatus for the vehicle. In addition, the processing arrangement, in particular the processing device, can be electrically connected (possibly via a further plug) to a vehicle electronic system. Via this connection, for example, the function on the vehicle can be activated, such as opening a lid or the like. The processing arrangement may further be part of an assembly component comprising the arrangement according to the invention. Thus, the arrangement according to the invention may already itself comprise the electronic system to perform the evaluation and control of the sensor element and/or the detection of the activation action. It is therefore possible to dispense with the need for the vehicle electronic system to carry out the control and/or evaluation of the sensor element. Thus, a versatile use of the arrangement according to the invention is enabled.

According to an advantageous further development of the invention, it can be provided that the additional conductor of the sensor arrangement is functionless or that a functionless additional conductor is provided for the sensing, which can be specific for an influence of an electric induction at the sensor element. The additional conductor can be, for example, a non-used conductor of the sensor arrangement, in particular of a cable. The use of the sensor arrangement or the cable offers the advantage of easy assembly and low production costs. Also, keeping the additional conductor can reduce the complexity of the arrangement, since removing the additional conductor would mean an additional assembly effort. However, induction can be accepted as an interfering effect, and can be specifically countered by using the filter arrangement. The filter arrangement can be specially designed for the induction caused by the additional conductor. For this purpose, tests and/or calibrations are carried out, for example, in order to dimension the filter arrangement in such a way that the interference frequencies caused by the induction are predominantly reduced. In other words, the filtering by the filter arrangement enables to attenuate the shifting current.

Furthermore, it is conceivable that the or a sensor arrangement is provided in the form of a coaxial cable, which comprises the sensor element in the form of an outer conductor of the coaxial cable and an additional conductor in the form of an inner conductor (i.e. a core) of the coaxial cable. Thus, a particularly advantageous and easy to assemble design of the sensor arrangement can be used.

It can also be provided that both the at least one sensor element and the at least one additional conductor of the sensor arrangement are electrically connected to the signal path—in particular via the terminal coupling. Thus, a current flow between the sensor element and the additional conductor can also influence the evaluation by the evaluation arrangement.

Also an object of the invention is a method for detecting an activation action for the activation of a function on a vehicle, in particular for detecting an activation action in a front, side and/or rear region of the vehicle for the activation of an opening and/or unlocking of a lid on the vehicle.

Here it is provided that the following steps are carried out, preferably one after the other or in any order, wherein individual or several steps can also be carried out repeatedly and/or at least partially in parallel, and if necessary all steps are carried out repeatedly:

carrying out a sensing of a change, in particular an approach by an activation means, by a (in particular electrically conductive) sensor element in a vicinity of the sensor element, wherein the vicinity preferably extends between a vehicle component such as a bumper and a ground surface on which the vehicle is standing, controlling the sensor element by a (in particular electronic) controlling arrangement to provide a sensing signal (in particular for the sensing of the change) whose frequencies comprise at least one predefined sensing frequency, carrying out a determination of at least one parameter specific to the sensing, such as a sensor capacitance, of the sensor element for the detection of the activation action by means of an (in particular electronic) evaluation arrangement, wherein the evaluation arrangement can be interconnected to the sensor element via a signal path in order to carry out the determination repeatedly on the basis of the sensing signal, carrying out at least one reduction of the frequencies of the sensing signal lower than the at least one sensing frequency by a filter arrangement in the signal path, which may comprise at least one high-pass.

Thus, the method according to the invention has the same advantages as have been described in detail with reference to an arrangement according to the invention. It is also optionally conceivable that the method is carried out by an arrangement according to the invention.

Also an object of the invention is a use of the arrangement according to the invention and/or a filter arrangement of an arrangement according to the invention for reducing an influence of an electric induction in a sensor element of an arrangement according to the invention. Thus, the use according to the invention has the same advantages as have been described in detail with reference to an arrangement or method according to the invention.

Figure 2:
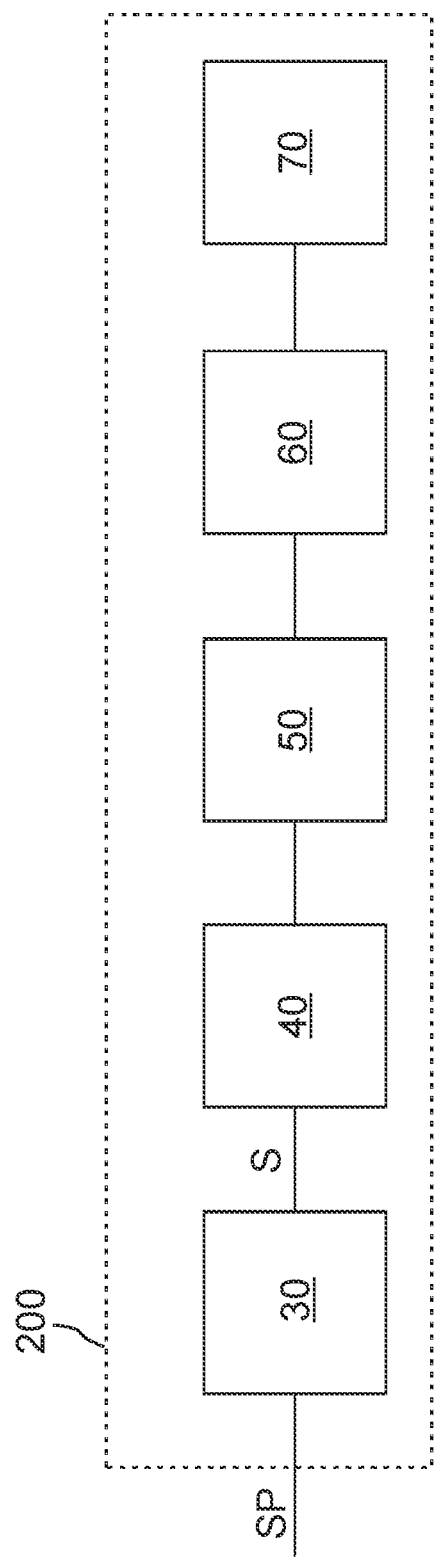
Figure 3:
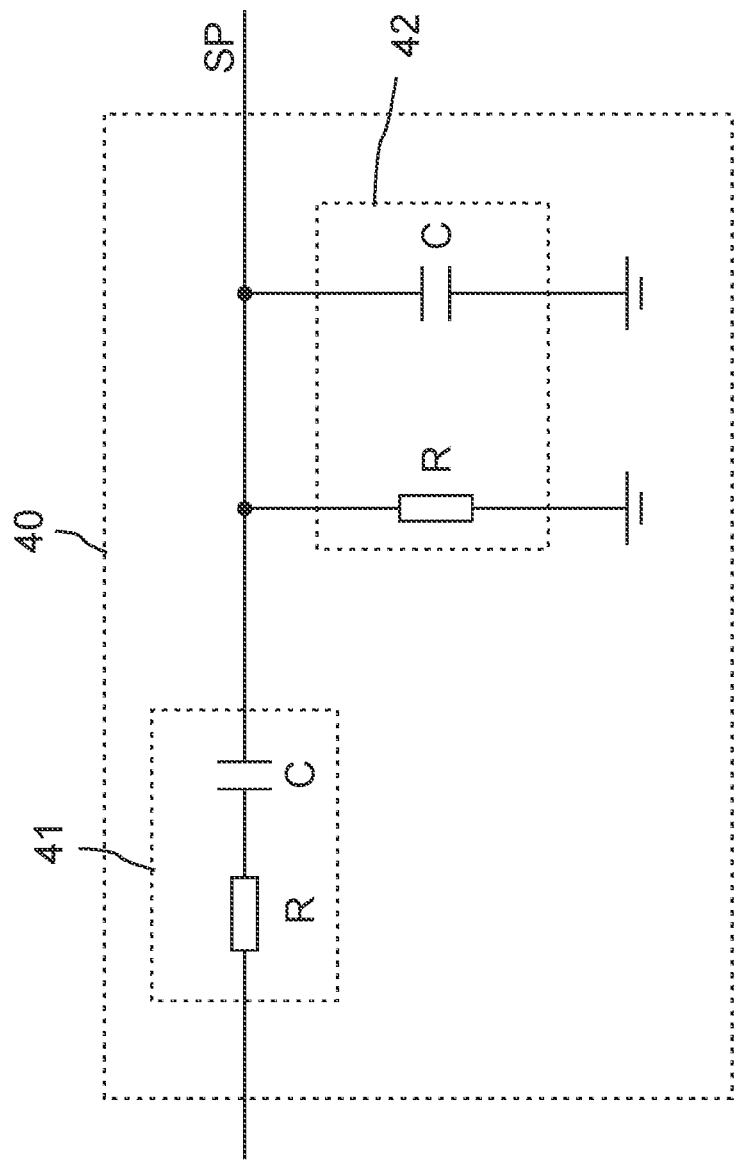
Figure 4:
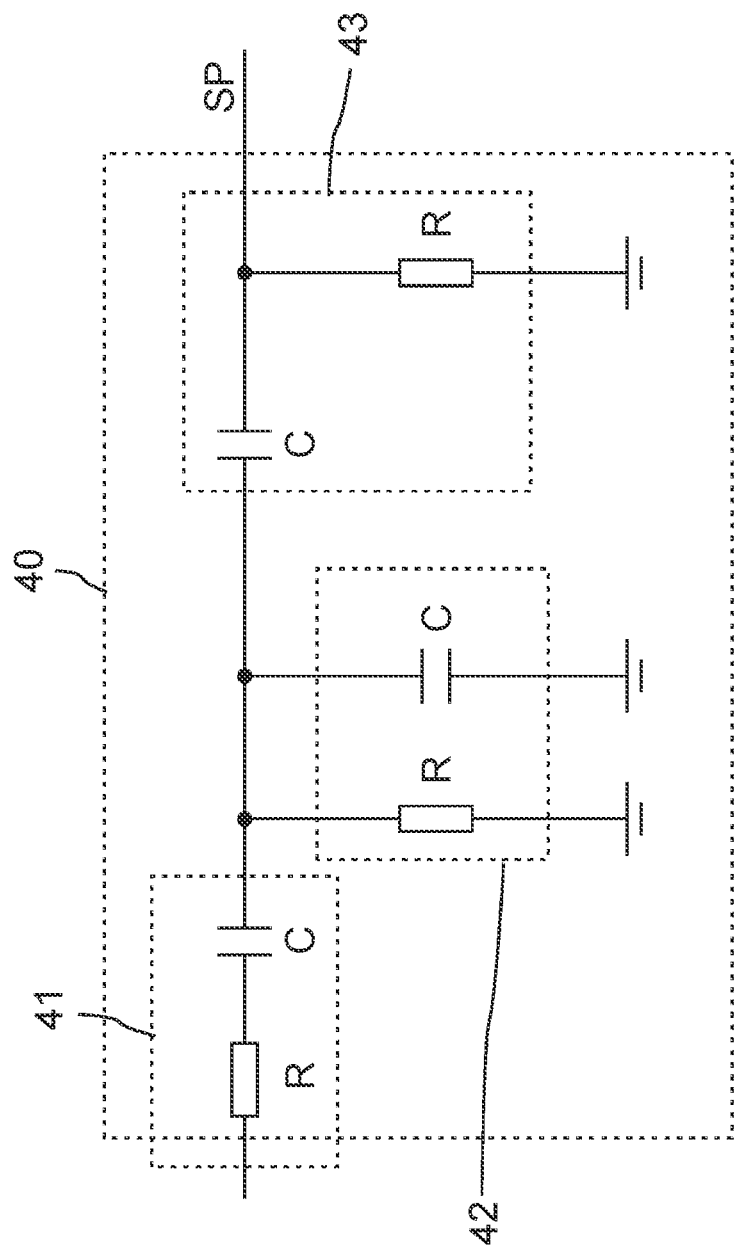
Figure 5:
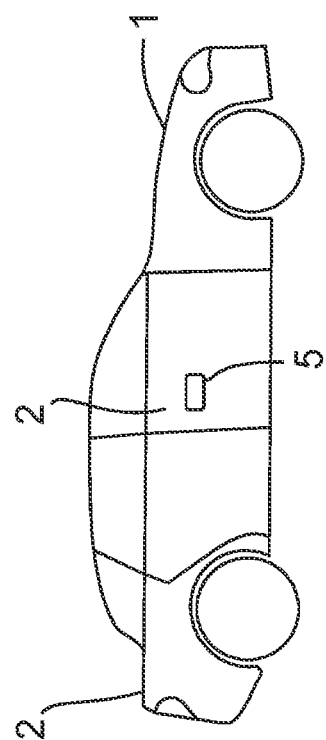
Figure 6:
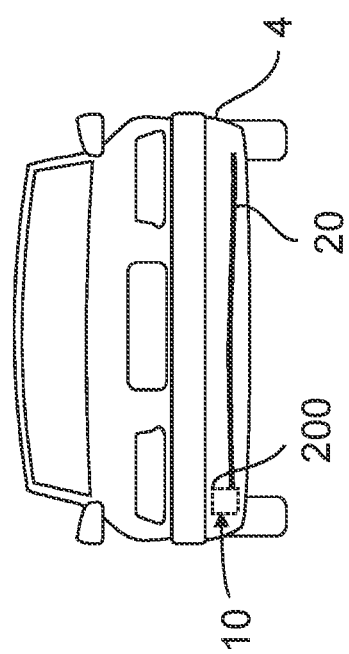
Figure 7:
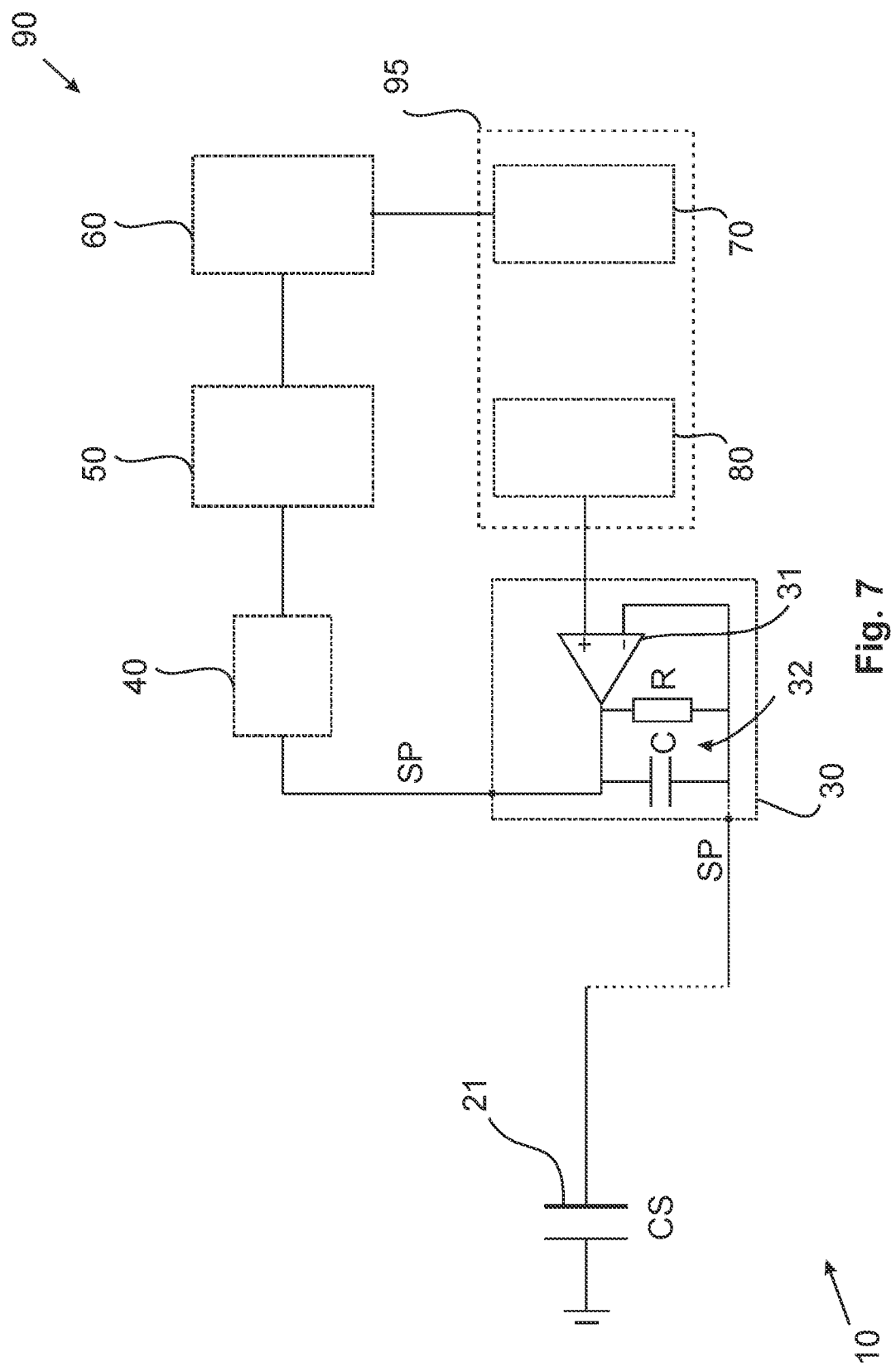

Further advantages, features and details of the invention will be apparent from the following description, in which embodiments of the invention are described in detail with reference to the figures. In this connection, the features mentioned in the claims and in the description may each be essential to the invention individually or in any combination. The figures show:

FIG. 1 a schematic representation of parts of an arrangement according to the invention, FIG. 2 another schematic representation of parts of an arrangement according to the invention for visualizing a use according to the invention and a method according to the invention, FIG. 3 a schematic representation of a filter arrangement, FIG. 4 another schematic representation of a filter arrangement, FIG. 5 a schematic side view of a vehicle with an arrangement according to the invention, FIG. 6 a schematic rear view of a vehicle with an arrangement according to the invention, FIG. 7 another schematic representation of parts of an arrangement according to the invention.

In the following figures, the identical reference signs are used for the same technical features even of different embodiment examples.

FIG. 1 shows an arrangement 10 according to the invention for a vehicle 1 for detecting an activation action for activating a function on the vehicle 1. As shown in FIG. 5, the arrangement 10 according to the invention can also be used for detecting an activation action in a front, side and/or rear region of the vehicle 1 for activating an opening and/or unlocking of a lid 2 on the vehicle 1. For this purpose, the arrangement 10 according to the invention may be, if necessary, specifically designed to be mounted on the vehicle 1 in a corresponding position (in the front, side or rear region). For example, the arrangement 10 according to the invention can comprise a housing with corresponding positioning means for this purpose, which enable the fixing specifically in the position provided for this purpose on the vehicle 1.

In addition to the fixing of the arrangement 10 according to the invention in a bumper 4, a further conceivable position is, for example, the fixing in a door handle 5 or another vehicle component. Exemplarily, the fixing of the arrangement 10 according to the invention in the bumper 4 is shown in FIG. 6, in which a sensor arrangement 20 (and correspondingly a sensor element 21 and/or an additional conductor 22) of the arrangement 10 according to the invention extend in the transverse direction of the vehicle (over more than half the extension of the bumper 4 in this direction) and are electrically connected to a processing arrangement 200. Thus, the sensor element 21 may serve to sense a change, in particular an approach by an activation means 3 such as a foot of a user, in a vicinity of the sensor element 21. For example, a movement of the foot below the bumper 4 and back again is detected as an activation action.

FIG. 1 shows that the sensor arrangement 20 (e.g. in the form of a coaxial cable 20) may comprise the sensor element 21 in the form of an outer conductor 21 and the additional conductor 22 in the form of an inner conductor 22. Thus, the sensor element 21 spatially surrounds the additional conductor 22. Between the sensor element 21 and the additional conductor 22, the sensor arrangement 20 may comprise an insulation means. Via electric connection points 28, the sensor element 21 and the additional conductor 22 may be electrically connected to a terminal arrangement 25 via respective terminals A2, A1. The terminal arrangement 25 comprises, for example, a connection device such as a plug connector 26, and further comprises a first electric terminal A1 for the additional conductor 22 and a second electric terminal A2 for the sensor element 21. Furthermore, the terminal arrangement 25 can comprise a terminal coupling 27, which can optionally also be provided outside the terminal arrangement 25. Via the terminal coupling 27, in particular at least or exactly one resistor, the sensor element 21 may be galvanically connected to the additional conductor 22. Both the sensor element 21 and the additional conductor 22 may be electrically connected to a signal path SP via the terminal coupling 27. The signal path SP may serve to transfer charge between the sensor element 21 (and possibly also the additional conductor 22) and the processing arrangement 200.

It should be noted that alternative terminal couplings 27 are also conceivable here, or the additional conductor 22 can also be completely isolated from the sensor element 21. For example, a capacitive coupling can also be provided between the additional conductor 22 and the sensor element 21. The occurrence of induction-induced shifting currents may be causally dependent on the terminal coupling 27, but may alternatively or additionally depend on other factors. Therefore, the invention is not limited to variants having the terminal coupling 27 in the form shown.

FIG. 2 shows the arrangement 10 according to the invention with further details. It can be seen that the sensor element 21 (and possibly the additional conductor 22) is interconnected via the signal path SP first to a transmission arrangement 30 and then to a filter arrangement 40 of the processing arrangement 200. In this way, a sensing signal S can be transmitted via the signal path SP to the evaluation arrangement 90 (shown in FIG. 7). The evaluation arrangement 90 may comprise a rectifier arrangement 50 and/or an integrator arrangement 60 and/or a converter arrangement 70 for evaluating the sensing signal S. The converter arrangement 70 can convert the output signal of the integrator arrangement 60 into a digital signal which can be further evaluated by a processing device 95, e.g. compared with a threshold value, in order to detect the activation action.

A concrete design of the arrangement 10 according to the invention for the control of the sensor element 21 and the evaluation of the sensing signal S is shown as an example in FIG. 7. An electronic controlling arrangement 80 is provided for electric control of the sensor element 21 in order to provide the sensing signal S, the frequencies of which comprise at least one predefined sensing frequency. Furthermore, the evaluation arrangement 90 is provided, which is interconnected to the sensor element 21 via the signal path SP, in order to carry out a repeated determination of at least one parameter of the sensor element 21 specific to the sensing for the detection of the activation action on the basis of the sensing signal S. This parameter is in particular a variable sensor capacitance CS. As shown in FIG. 7, the sensor element 21 can therefore be understood as a sensor electrode 21 of a capacitor with the sensor capacitance CS, which forms the sensor capacitance CS with respect to a mass potential.

Furthermore, the filter arrangement 40 may be integrated in the signal path SP, which comprises at least one high-pass 41, 43 to at least reduce the frequencies of the sensing signal S lower than the at least one sensing frequency.

Furthermore, the transmission arrangement 30 may be provided in the signal path SP between the sensor element 21 and the filter arrangement 40, and may comprise an electric and in particular electronic voltage follower to provide the sensing signal S to the filter arrangement 40 depending on the variable sensor capacitance CS of the sensor element 21. The transmission arrangement 30 may comprise at least one filter element 32, such as a capacitor C and/or a resistor R, to improve the provision of the sensing signal S. Furthermore, the transmission arrangement 30 may comprise an operational amplifier 31 to provide the voltage follower.

The filter arrangement 40 is shown in FIGS. 3 and 4 with further details. Here, the filter arrangement 40 can comprise a first sub-arrangement 41 with the high-pass 41 and a second sub-arrangement 42 with a low-pass 42. According to FIG. 4, the filter arrangement 40 may comprise the high-pass 41, 43 in the manner of a second-order high-pass 41, 43, and for this purpose may comprise a third sub-arrangement 43 with a further high-pass 43. Each sub-arrangement 41, 42, 43 may further comprise a filter element such as an RC element. Accordingly, the filter arrangement 40 may form a band-pass filter.

The variants of the filter arrangement 40 shown are designed to reduce an influence of an electric induction at the sensor element 21, in particular to reduce a shift of electric charges due to the action of an electric field on the sensor element 21. Accordingly, the filter arrangement 40 may also be referred to as an induction filter. The filter arrangement may be designed as a band-pass with a center frequency f0, wherein the center frequency f0 corresponds to the operating frequency of the arrangement according to the invention, i.e. the sensing frequency, in particular 333 kHz.

FIG. 2 also illustrates the method steps of a method according to the invention. Accordingly, in accordance with a first method step, a sensing of a change, in particular of an approach by an activation means 3, can be carried out by a sensor element 21 in a vicinity of the sensor element 21. For this purpose, according to a second method step, a control of the sensor element 21 by a controlling arrangement 80 can be carried out in order to provide a sensing signal S whose frequencies comprise at least one predefined sensing frequency. Subsequently, in accordance with a third method step, it may be possible to carry out a determination of at least one parameter of the sensor element 21 specific to the sensing for the detection of the activation action by means of an evaluation arrangement 90, wherein the evaluation arrangement 90 is interconnected to the sensor element 21 via a signal path SP in order to carry out the determination repeatedly on the basis of the sensing signal S. Furthermore, according to a fourth method step, it is provided that at least one reduction of the frequencies of the sensing signal S lower than the at least one sensing frequency is carried out by a filter arrangement 40 in the signal path SP. Accordingly, the filter arrangement 40 can be used to enable a reduction of an influence of an electric induction at the sensor element 21 of the arrangement 10 according to the invention.

The foregoing explanation of the embodiments describes the present invention exclusively in the context of examples. Of course, individual features of the embodiments can be freely combined with each other, provided that this is technically reasonable, without leaving the scope of the present invention.

LIST OF REFERENCE SIGNS 1 vehicle
2 lid
3 activation means
4 bumper
5 door handle
10 arrangement
20 sensor arrangement, coaxial cable
21 sensor element, outer conductor, shielding
22 additional conductor, inner conductor, core
25 terminal arrangement
26 plug
27 terminal coupling
28 connection points
30 transmission arrangement, CVF
31 operational amplifier
32 filter elements
40 filter arrangement, BP
41 first sub-arrangement, high-pass
42 second sub-arrangement, low-pass
43 third sub-arrangement, high-pass
50 rectifier arrangement, CR
60 integrator arrangement, INT
70 converter arrangement, analogue-digital converter
80 controlling arrangement
90 evaluation arrangement
95 processing device
200 processing arrangement
41, 43 high-pass
A1 first terminal
A2 second terminal
C capacitor
CS sensor capacitance
R resistance
S sensing signal
SP signal path

The invention claimed is:
1. An arrangement for a vehicle for detecting an activation action for activating a function on the vehicle, comprising:
at least one electrically conductive sensor element for capacitive sensing a change in a vicinity of the sensor element, a controlling arrangement for an electric control of the sensor element with a controlling signal in order to provide a sensing signal, frequencies of which comprise at least one predefined sensing frequency, an evaluation arrangement, which is interconnected to the sensor element via a signal path in order to use the sensing signal to repeatedly determine at least one parameter of the sensor element specific to the capacitive sensing for detecting the activation action, and a filter arrangement in the signal path comprising at least one high-pass in order to at least reduce the frequencies of the sensing signal lower than the at least one predefined sensing frequency, wherein a transmission arrangement is provided in the signal path between the sensor element and the filter arrangement, which comprises an electric voltage follower in order to provide the sensing signal to the filter arrangement depending on a variable sensor capacitance of the sensor element.

2. The arrangement according to claim 1, wherein
the sensor element is an electrically conductive sensor electrode in order to provide the at least one parameter specific to the sensing in a form of a variable sensor capacitance, wherein the evaluation arrangement comprises an electronic processing device in order to evaluate the change in the sensor capacitance on a basis of the sensing signal.

3. The arrangement according to claim 1, wherein
the evaluation arrangement comprises an integrator arrangement for evaluating a charge quantity transmitted by the sensing signal and dependent on the change.

4. The arrangement according to claim 1, wherein
the filter arrangement comprises the high-pass as a second-order high-pass.

5. The arrangement according to claim 1, wherein
the filter arrangement comprises a first sub-arrangement with the high-pass and a second sub-arrangement with a low-pass.

6. The arrangement according to claim 5, wherein
the filter arrangement comprises a third sub-arrangement with a further high-pass.

7. The arrangement according to claim 1, wherein
the filter arrangement is configured to reduce an influence of an electric induction at the sensor element, wherein the influence of an electric induction is caused by static charges and/or by electric induction.

8. The arrangement according to claim 1, wherein
a sensor arrangement comprising the sensor element and an additional electric conductor, wherein the additional conductor is arranged at least partially or predominantly parallel to the sensor element.

9. The arrangement according to claim 1, wherein
an additional conductor is electrically coupled to the sensor element via a terminal coupling, wherein the terminal coupling is configured to be a circuit arrangement of at least one component and comprises a first terminal for connection to the sensor element and a second terminal for connection to the conductor.

10. The arrangement according to claim 1, wherein
a sensor arrangement comprises an additional conductor which is functionless for the sensing and which is specific for an influence of an electric induction at the sensor element, wherein the additional conductor is a non-used conductor of a cable.

11. The arrangement according to claim 1, wherein
a coaxial cable as a sensor arrangement comprises the sensor element in the form of an outer conductor of the coaxial cable and an additional conductor in the form of an inner conductor of the coaxial cable.

12. A method for reducing an influence of an electric induction in a sensor element comprising deploying an arrangement according to claim 1 so as to reduce an influence of an electric induction in a sensor element.

13. A method for detecting an activation action for the activation of a function on a vehicle,
wherein the following steps are carried out:
carrying out a sensing of a change by a sensor element in a vicinity of the sensor element,
controlling the sensor element by a controlling arrangement to provide a sensing signal whose frequencies comprise at least one predefined sensing frequency,
carrying out a determination of at least one parameter specific to the sensing of the sensor element for the detection of the activation action by means of an evaluation arrangement, wherein the evaluation arrangement is interconnected to the sensor element via a signal path in order to carry out the determination repeatedly on the basis of the sensing signal,
carrying out at least one reduction of the frequencies of the sensing signal lower than the at least one sensing frequency by a filter arrangement in the signal path, which comprises at least one high-pass, and
providing the sensing signal to the filter arrangement depending on a variable sensor capacitance of the sensor element by means of an electric voltage follower of a transmission arrangement, wherein the transmission arrangement is provided in the signal path between the sensor element and the filter arrangement.

14. The arrangement according to claim 1 configured for reducing an influence of an electric induction in a sensor element.

* * * * *